United States Patent
Nalwa et al.

(10) Patent No.: US 10,038,142 B1
(45) Date of Patent: Jul. 31, 2018

(54) ORGANIC PHOTOVOLTAIC DEVICE WITH FERROELECTRIC DIPOLE AND METHOD OF MAKING SAME

(71) Applicants: Kanwar Singh Nalwa, Portland, OR (US); Sumit Chaudhary, Ames, IA (US)

(72) Inventors: Kanwar Singh Nalwa, Portland, OR (US); Sumit Chaudhary, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 15/935,284

(22) Filed: Mar. 26, 2018

Related U.S. Application Data

(63) Continuation of application No. 13/780,697, filed on Feb. 28, 2013, now Pat. No. 9,966,533.

(Continued)

(51) Int. Cl.
*H01L 21/00* (2006.01)
*H01L 51/00* (2006.01)
*H01L 51/42* (2006.01)

(52) U.S. Cl.
CPC ........ H01L 51/0035 (2013.01); H01L 51/424 (2013.01); H01L 51/4293 (2013.01);
(Continued)

(58) Field of Classification Search
CPC ............... H01L 51/0035; H01L 51/424; H01L 51/4293; H01L 51/0036; H01L 51/0037; H01L 2251/308; Y02E 10/549
See application file for complete search history.

(56) References Cited

U.S. PATENT DOCUMENTS

2009/0165861 A1* 7/2009 Yoshimoto ............. B82Y 10/00
136/263

2010/0258190 A1* 10/2010 Huang ................... B82Y 10/00
136/263

(Continued)

FOREIGN PATENT DOCUMENTS

DE 102008060179 A1 7/2010
KR 101069010 B1 9/2011

OTHER PUBLICATIONS

Kanwar S. Nalwa et al.; Design of Light-trapping Microscale-textured Surfaces for Efficient Organic Solar Cells; Optics Express; Mar. 1, 2010; 11 pages (5168-5178); vol. 18, No. 5.
J. Peet et al.; Efficiency Enhancement in Low-Bandgap Polymer Solar Cells by Processing with Alkane Dithiols; Nature Materials; Jul. 2007; 4 pages (497-500); vol. 6.
S. Y. Yang et al.; Above-bandgap Voltages from Ferroelectric Photovoltaic Devices; Nature Nanotechnology; Feb. 2010; 5 pages (143-147); vol. 5.
Kanwar S. Nalwa et al.; On Realizing Higher Efficiency Polymer Solar Cells Using a Textured Substrate Platform; Advanced Materials; 2011; 5 pages (112-116); vol. 23.

(Continued)

*Primary Examiner* — Charles Garber
*Assistant Examiner* — Abdulfattah Mustapha
(74) *Attorney, Agent, or Firm* — Reinhart Boerner Van Deuren P.C.

(57) ABSTRACT

A method of fabricating an organic photovoltaic device. The method includes providing a first electrode which by applying a layer of conductive material onto a transparent substrate. The conductive material forms the first electrode. The method also includes placing an active layer of organic photovoltaic material on top of the first electrode. The active layer is configured to convert photonic energy into electrical energy. Placing an active layer of organic photovoltaic material includes placing an active layer of organic photovoltaic material having ferroelectric dipoles dispersed therein. The method further includes applying a second electrode on top of the active layer of organic photovoltaic material.

20 Claims, 3 Drawing Sheets

Related U.S. Application Data

(60) Provisional application No. 61/606,000, filed on Mar. 2, 2012.

(52) U.S. Cl.
CPC ...... *H01L 51/0036* (2013.01); *H01L 51/0037* (2013.01); *H01L 2251/308* (2013.01); *Y02E 10/549* (2013.01)

(56) References Cited

U.S. PATENT DOCUMENTS

| | | | |
|---|---|---|---|
| 2012/0092181 A1* | 4/2012 | Daniel | G01D 7/005 340/691.1 |
| 2012/0118368 A1 | 5/2012 | Huang et al. | |
| 2012/0312375 A1 | 12/2012 | Seok et al. | |
| 2013/0001554 A1 | 1/2013 | Chung et al. | |

OTHER PUBLICATIONS

Hin-Lap Yip et al.; Polymer Solar Cells That Use Self-Assembled-Monolayer-Modified ZnO/Metals as Cathodes; Advanced Materials; 2008; 7 pages (2376-2382); vol. 20.

Diana Shvydka et al.; Nanodipole Photovoltaics; Applied Physics Letters; 2008; 4 pages; vol. 92.

Hin-Lap Yip et al.; Self-assembled Monolayer Modified ZnO/Metal Bilayer Cathodes for Polymer/Fullerene Bulk-Heterojunction Solar Cells; Applied Physics Letters; 2008; 4 pages; vol. 92.

L. Onsager; Initial Recombination of Ions; Physical Review; Oct. 15, 1938; 4 pages; vol. 54.

Kanwar S. Nalwa et al.; Enhanced Charge Separation in Organic Photovoltaic Films Doped with Ferroelectric Dipoles; Energy & Environment Science; 2012; 8 pages; vol. 5.

\* cited by examiner

ORGANIC PHOTOVOLTAIC DEVICE WITH FERROELECTRIC DIPOLE AND METHOD OF MAKING SAME

CROSS-REFERENCE TO RELATED PATENT APPLICATIONS

This patent application is a continuation of U.S. patent application Ser. No. 13/780,697, filed Feb. 28, 2013, which claims the benefit of U.S. Provisional Patent Application No. 61/606,000, filed Mar. 2, 2012, the entire teachings and disclosure of which are incorporated herein by reference thereto.

STATEMENT REGARDING FEDERALLY SPONSORED RESEARCH AND DEVELOPMENT

This invention was made in part with Government support under Grant Number ECCS 1055930 awarded by the National Science Foundation. The Government has certain rights in this invention.

FIELD OF THE INVENTION

This invention generally relates to photovoltaic devices, and, more particularly, to organic photovoltaic devices.

BACKGROUND OF THE INVENTION

With increasing attention toward carbon-neutral energy production, solar electricity—or photovoltaic (PV) technology—is receiving heightened attention as a potentially widespread approach to sustainable energy production. The current PV technology is based largely on the use of crystalline silicon wafers. It has proved very difficult with this technology to reduce the total system cost down to the level needed to achieve widespread adoption of this technology for energy production.

Organic photovoltaic (OPV) technology is an attractive alternative to silicon-based solar electric conversion. Advancements in organic solar cells and OLEDs include processing advantages that promise lower production costs and simpler fabrication methods when compared to their inorganic counterparts. Furthermore, organic solar cells (OSCs) offer the possibility of device fabrication on flexible substrates over large areas with higher throughput, which could greatly improve both their functionality and economy.

More specifically, polymer and small-molecule based OPVs have gained a lot of attention in recent years due to their potential low cost and roll-to-roll manufacturing capability, and amenability to flexible substrates. Some of the developments that have improved performance of OPVs are based on electron donor-acceptor heterojunctions. In a planar heterojunction, or 'bilayer' device, excitons are dissociated into charge-carriers at the donor-acceptor interface. The efficiency of PV conversion is, however, low because only the excitons created within the exciton-diffusion length from the donor-acceptor interface are utilized.

The introduction of bulk-heterojunction (BHJ) OPVs, in which the donor-acceptor materials are blended together, resulted in efficiency improvements for organic solar cells. If the length scale of the phase separation in the donor-acceptor blend is similar to the exciton-diffusion length, then all of the excitons photo-generated in either material can potentially diffuse to an interface and dissociate into free charge carriers. These charge carriers may then drift to their respective electrodes if continuous pathways exist in each material. The electron acceptors are often the fullerenes or their derivative, e.g., [6,6]-phenyl-C61-butyric acid methyl ester (PCBM) which have relatively high miscibility in organic solvents compared to other known acceptor materials. For OPVs with poly(3-hexylthiophene) (P3HT) as the electron donor, efficiencies of about 5% have been realized.

However, the performance of these bulk heterojunction devices is still limited by several factors. The high energy band gap of most polymer materials poses a limitation on the capability to harvest lower energy photons from sunlight. Moreover, the charge carrier mobility of these materials is generally low, making it necessary to keep the thickness of the active layer low. A thinner film between the electrodes can lower the probability for charge recombination which lowers device efficiency, and can also increase the carrier drift velocity due to higher electric field. However, the optical absorption will be low in such thin films. Thus, there is a conflict between the optical length scale and the electronic length scale. Another problem is charge recombination. Electron-hole pairs generated within the donor polymer on absorption of light still recombine if they do not find an acceptor interface within their lifetime. These electron-hole pairs are called singlet excitons. Even if these singlet excitons dissociate, the electron on the acceptor and the hole on the donor form charge-transfer excitons, which can again recombine. Thus, recombination of singlet and charge-transfer excitons is one of the biggest loss mechanism in modern organic solar cells.

It would therefore be desirable to have a method of fabricating organic photovoltaic devices that allows for increased dissociation of or reduced recombination of singlet excitons and charge-transfer excitons. Embodiments of the invention provides such a device. These and other advantages of the invention, as well as additional inventive features, will be apparent from the description of the invention provided herein.

BRIEF SUMMARY OF THE INVENTION

In one aspect, embodiments of the invention provide a method of fabricating an organic photovoltaic device. The method includes providing a first electrode which by applying a layer of conductive material onto a transparent substrate. The conductive material is configured to function as the first electrode. The method also includes placing an active layer of organic photovoltaic material onto the electrode. The active layer is configured to convert photonic energy into electrical energy. Placing an active layer of organic photovoltaic material includes placing an active layer of organic photovoltaic material having ferroelectric dipoles dispersed therein. The method further includes applying a second electrode onto the active layer of organic photovoltaic material.

In a particular embodiment of the invention, placing an active layer of organic photovoltaic material comprises placing an active layer of organic photovoltaic material made from a blend of poly(3-hexylthiophene) (P3HT), [6,6]-phenyl-C61-butyric acid methyl ester (PCBM), and poly (vinylidenefluoride-co-trifluoroethylene) (PVDF-TrFE). In some cases, the portion of the active layer of organic photovoltaic material that comprises PVDF-TrFE is between 0% and 25% by weight.

In certain embodiments, the P3HT, PCBM, and PVDF-TrFE are blended by dissolution in a solvent. In a particular embodiment, the solvent is configured to disperse the PVDF-TrFE primarily in the P3HT. In an alternate embodiment, the solvent is configured to disperse the PVDF-TrFE primarily in the PCBM. In yet another embodiment, the solvent is configured to disperse the PVDF-TrFE equally well in both the P3HT and the PCBM.

The method may also include depositing a thin film of PVDF-TrFE between the active layer and the first electrode. In one aspect of the invention, this done by blending PVDF-TrFE with P3HT and depositing a layer of the blended PVDF-TrFE and P3HT between the first electrode and the active layer. In another aspect of the invention, the thin film is deposited by blending PVDF-TrFE with poly(3, 4-ethylenedioxythiophene) (PEDOT) that is doped with poly(styrenesulfonate) (PSS) (hereinafter "PEDOT:PSS") and depositing a layer of the blended PVDF-TrFE and PEDOT:PSS between the first electrode and the active layer. In yet another aspect of the invention, the method includes depositing a layer of PVDF-TrFE onto a layer PEDOT:PSS which has been applied to the first electrode before deposition of the active layer.

The method may further include depositing a thin film of PVDF-TrFE between the active layer and the first or second electrode. In one aspect of the invention, this done by blending PVDF-TrFE with PCBM and depositing the blended layer of PVDF-TrFE and PCBM between the active layer and the second electrode. In another aspect of the invention, the thin film is deposited by blending PVDF-TrFE with titanium dioxide ($TiO_2$) or zinc oxide (ZnO) nanoparticles and depositing the blended layer of PVDF-TrFE and either $TiO_2$ or ZnO between the active layer and the first electrode. In yet another aspect of the invention, the method includes depositing a layer of PVDF-TrFE onto the active layer before deposition of the second electrode.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
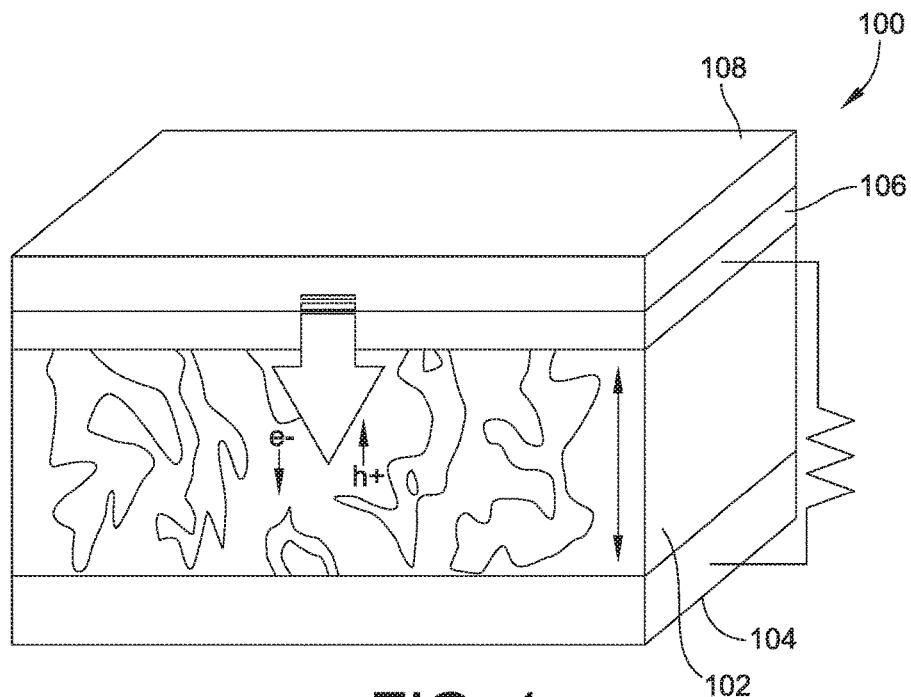
FIG. 1 is a perspective view of an organic photovoltaic device (OPV) employing a bulk heterojunction active layer.

The state-of-the-art organic photovoltaic (OPV) device architecture is the so-called bulk-heterojunction (BHJ) type, illustrated in the perspective drawing of FIG. 1, in which an active layer 102 is formed from a blend of electron donor (i.e., conjugated polymers) and acceptor (i.e., fullerene derivatives) species. In the embodiment of FIG. 1, the active layer 102 is sandwiched between a metal electrode 104, and a transparent electrode 106, such as indium-tin oxide (ITO). As can be seen from FIG. 1, the active layer 102, metal electrode 104, and transparent electrode 106 are deposited on a transparent substrate 108, such as glass. One of the most critical issues in the design of OPVs stem from the difference in the optimum length scales required for collection of the photo-generated carriers and for absorption of the incoming optical energy.

As alluded to above, a significant factor that significantly affects the performance of OPV devices is recombination of charge carriers. In thinner structures, more photo-generated carriers can be collected before their annihilation through recombination. On the other hand, thicker structures allow the incoming light wave to penetrate deeper into the active layer and, therefore, ensure a higher degree of absorption of the photons. In these devices, the work function difference between the anode (i.e., transparent electrode 106) and cathode (i.e., metal electrode 104) produces a built-in electric field inside the active layer essential for extraction of charges. When the active layer 102 thickness is increased, the built-in electric field sets an upper bound on achievable open-circuit voltage and current density due to pronounced recombination losses. These losses restrain the device performance in spite of the higher optical absorption of the thick active layer 102.

A number of factors affect the photocurrent, including the degree of overlap between the donor/acceptor absorption spectra with the solar spectrum, exciton dissociation efficiency, charge separation efficiency at the donor/acceptor interface, and charge transport. High dielectric constant and nano-dipoles of ferroelectrics can also, in principle, alter all the above phenomena and lead to enhanced photocurrent.

With respect to exciton dissociation efficiency, it is estimated that non-radiative recombination accounts for nearly 50% of efficiency loss in conventional OPVs. Generally, an external bias (i.e., an electric field) is used to collect all of the photo-generated charges to prevent their recombination. One way to induce such an electric field in an OPV is to incorporate ferroelectric dipoles into an otherwise low-mobility conjugated-polymer-base active layer 102. Use of ferroelectric dipoles facilitates singlet exciton dissociation in the polymer matrix and impedes charge transfer exciton recombination as the polymer-fullerene interface.

Figure 2:
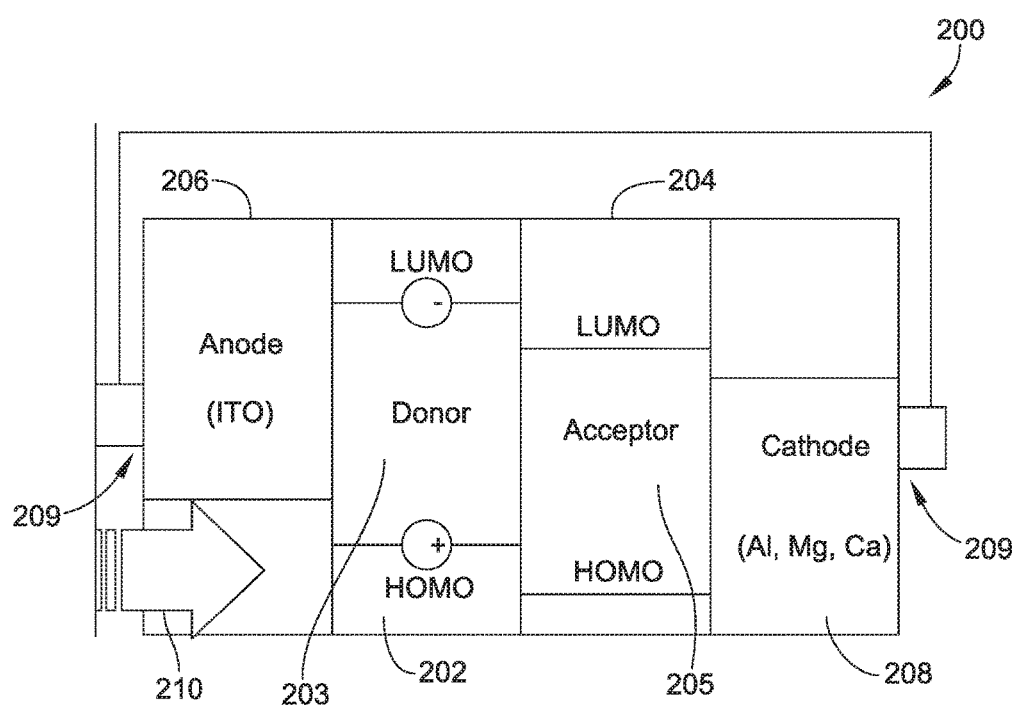
FIG. 2 is a schematic block diagram illustrating an exemplary work function in an OPV.

FIG. 2 is a schematic block diagram illustrating an exemplary work function in an OPV device 200. The open-circuit voltage in the OPV device 200 is affected by the dark current, the difference in highest occupied molecular orbital 202 (HOMO) of the donor species 203 and lowest unoccupied molecular orbital 204 (LUMO) of the acceptor species 205, and the work function of difference between an anode 206 and a cathode 208. Ferroelectric dipoles can also cause a shift in the energy levels if the ferroelectric material is placed adjacent to the donor species 203 and acceptor species 205, and/or at the organic electrode interface 209. Such a placement can reduce the dark current by reducing the intermolecular coupling, and also alter the effective work-function of non-ohmic electrodes to make them ohmic, hence increasing the photo-induced voltage. Arrow 210 shows the direction of light incident upon OPV device 200.

Embodiments of the invention include a method that utilizes the reversible polarization of a ferroelectric co-polymer, such as poly (vinylidenefluoride-co-trifluoroethylene) (PVDF-TrFE), as an additive to the active layer.

Although there are a variety of inorganic and organic piezoelectric materials, the choice of PVDF-TrFE is appropriate owing to its solution processability, high static dielectric constant (e.g., approximately 10), and its existence in an all-trans β phase (ferroelectric phase) at room temperature. Moreover, multifaceted incorporation of ferroelectric dipoles in the bulk of the PV active layer and at its interfaces with the electrode in order to improve the efficiency of conjugated polymer-based PVs is disclosed.

Ferroelectric materials have a spontaneous electric polarization that can be reversed by the application of an external field. Their typical applications are in capacitors, memories, dielectrics in transistors, and actuators. Ferroelectric materials are required by symmetry considerations also to be piezoelectric and pyroelectric. PV behavior also has been observed in ferroelectrics, both organic and inorganic, mostly with above band-gap open circuit voltages and low photocurrents.

As will be shown below, carrier extraction at the electrodes can be made more efficient (minimizing recombination losses) by dispersing ferroelectric dipoles in the volume of active layer, thus enhancing electric field within the bulk of charge transport layer. In an embodiment of the invention, ferroelectric dipoles embedded in the active layer can create a reverse electric field as strong as $10^5$ volts per meter (V/m) even at volume fractions of just 10%. Such use of ferroelectric materials within the bulk active layer can lead to efficient exciton dissociation even within the donor polymer matrix. The high dielectric constant of the ferroelectric additive can further increase the exciton dissociation efficiency, according to the well-accepted Onsager's theory that the charge dissociation efficiency is inversely proportional to dielectric constant of the medium.

Figure 3:
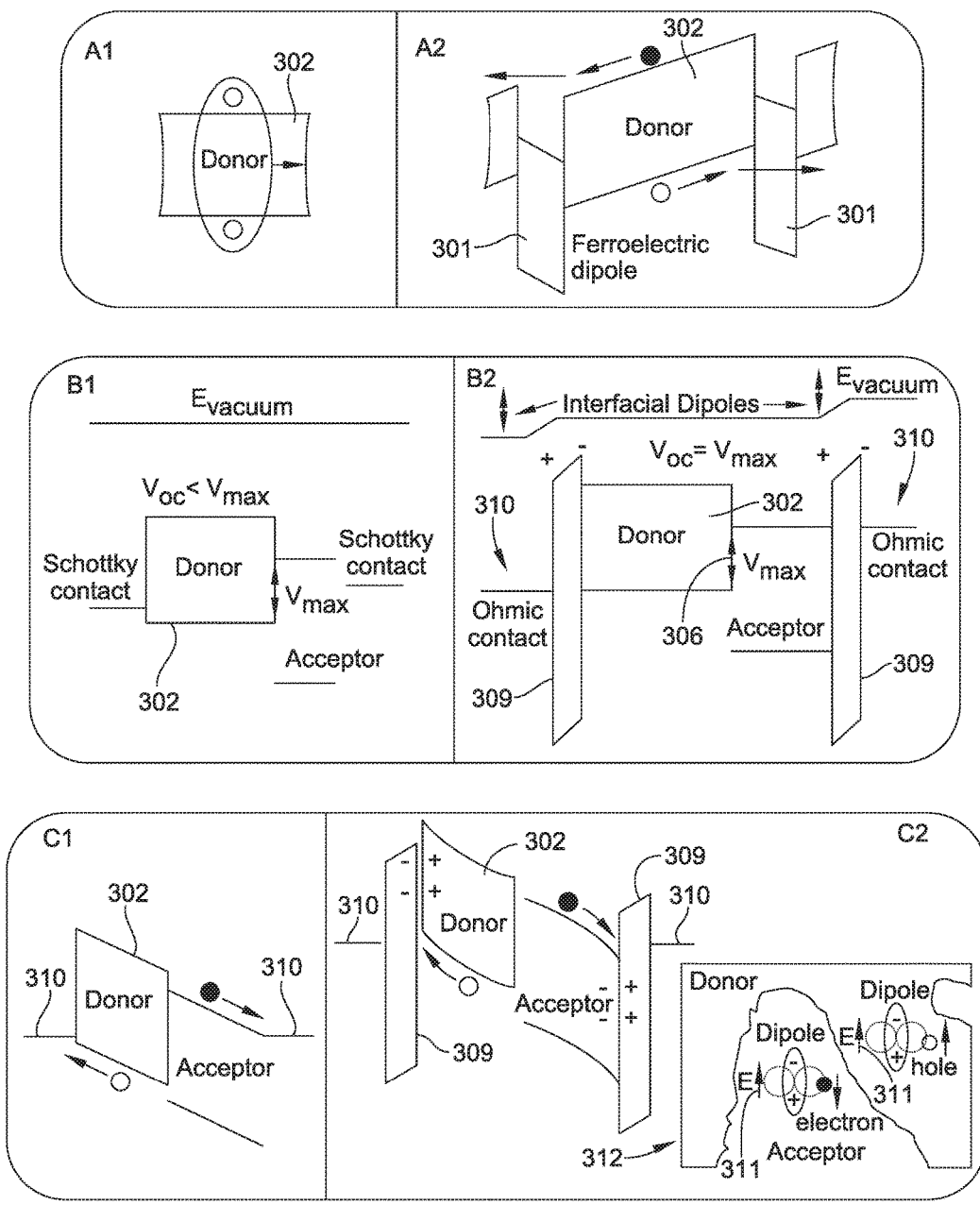
FIG. 3 is an illustration of energy band diagrams for a conventional device and for an embodiment of the invention.

FIG. 3 illustrates several energy band diagrams for a conventional OPV device and for an OPV device constructed in accordance with an embodiment of the invention. The energy band diagrams depict several of the key aspects for the proposed device engineering paradigm, which utilizes the reversible internal dipoles 301 of ferroelectric materials, and their high dielectric constant. Shown in panel (A1) illustrating an energy band diagram for a conventional device, the excitons created in the donor 302 are tightly bound and they diffuse to the donor/acceptor interface where they dissociate. Shown in panel (A2), which illustrates an energy band diagram for an embodiment of the present invention, ferroelectric dipoles 301 embedded in the donor can create a reverse electric field as strong as $10^5$ volts per meter (V/m) even at volume fraction of 1%. This reverse electric field created in the donor 302 by the polarization interfacial charge of dipoles 301, can lead to exciton dissociation even within the donor polymer matrix. Charge movement is not affected by the dipole barrier due to the small volume faction of dipoles 301. The high dielectric constant of ferroelectric materials can further increase the exciton dissociation efficiency. With respect to panel (B1), in conventional OPVs, the choice of electrode material is limited because unsuitable electrodes 310 can lead to Schottky barriers and a reduced electric field within the device, thus affecting the open-circuit voltage (Voc). With respect to panel (B2), embodiments of the invention permit formerly unsuitable electrodes to be made ohmic by interfacial ferroelectric dipoles 309 at organic/electrode interface 306. This interfacial dipole layer 309 obviously should be thin so as to not disrupt the charge transport. In panel (C1), upon exciton dissociation in conventional OPVs, the charges drift towards the electrodes 310. A number of them are lost due to recombination. As shown in panel (C2), in an embodiment of the invention having ferroelectric dipoles 301, carrier extraction at the electrodes 310 can also be enhanced due to increased band bending induced by interfacial ferroelectric dipoles 309, and due to a dipole-induced enhanced electric field, as indicated by arrows 311, within the bulk of charge transport layers 312.

Thus, it can be seen from the embodiments of the invention described hereinabove, the open-circuit voltage ($V_{oc}$) is also increased by inserting a very thin ferroelectric dipole film as a buffer layer between active layer (i.e. donor 302) and the electrode 310, which essentially changes the work-function of the electrode 310 due to interfacial dipoles 309. This serves to increase the electric field in the charge transport layer by increasing the work-function difference between anode 206 (in FIG. 2) and cathode 208 (in FIG. 2). As a result, there is efficient charge extraction at the electrode 310 even when non-ohmic contacts are utilized. As referenced above, because non-ohmic contacts can be fabricated less expensively than conventional ohmic contacts, the method disclosed herein makes a larger variety of cheap metallic conductors usable for OPV electrode formation.

Figure 4:
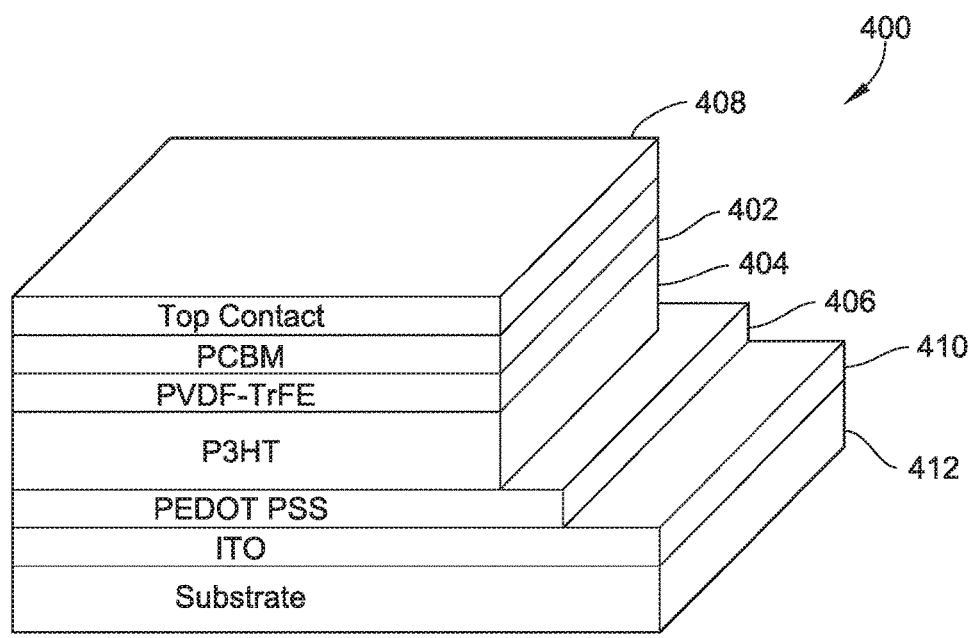
FIG. 4 is a schematic block diagram of an organic photovoltaic device constructed in accordance with an embodiment of the invention.

FIG. 4 is a schematic block diagram of an organic photovoltaic device 400 constructed in accordance with an embodiment of the invention. In particular embodiments of the invention, PVDF-TrFE 402 is incorporated into the bulk of a P3HT:PCBM active layer 404. Typically, there are three locations in the P3HT:PCBM active layer 404 of a BHJ type device where PVDF-TrFE 402 can be incorporated: (1) inside the P3HT phase, (2) inside the PCBM phase, and (3) at the interface between the P3HT and PCBM. The PVDF-TrFE 402 will be blended in the P3HT:PCBM solution and then spin-coated. Each of the above-mentioned three configurations can be achieved by using the approach of solvent mixtures and with a careful choice of participating solvents. Four cases can be considered in a solvent mixture approach:
1) If a solvent is a good solvent for P3HT, PCBM, and PVDF-TrFE 402, then PVDF-TrFE 402 will typically be homogeneously dispersed in both the P3HT and PCBM phases;
2) If a solvent is a good solvent for P3HT and PVDF-TrFE 402, but a poor solvent for PCBM, then PVDF-TrFE 402 will typically be predominantly inside the P3HT phase;
3) If a solvent is a good solvent for PCBM and PVDF-TrFE 402, but a poor solvent for P3HT, then PVDF-TrFE 402 will typically be predominantly inside the PCBM phase; and
4) If a solvent is a good solvent for PVDF-TrFE 402, but a poor solvent for both P3HT and PCBM, or vice versa, then PVDF-TrFE 402 will typically locate only at the interface of the P3HT and PCBM phases.

There are a variety of solvents in which PVDF-TrFE 402 can be dissolved. Several of them are high-boiling-point solvents and others are low-boiling-point solvents. To avoid the gel formation stage, the solution may be agitated while cooling by using ultrasonication. This method has been shown to prevent gelation in other conjugated polymer systems. For example, THF, N-methyl-pyrrolidone, and cyclohexanone may be used as potential PVDF-TrFE solvents.

Using the solvent mixtures approach, various concentrations of PVDF-TrFE 402 may be blended in the active layer allowing for the formulations of optimum concentration windows by screening of the current-voltage characteristics of the resultant PV devices. Typically, the optimal concentrations will be between 0% and 25% of PVDF-TrFE 402 by weight.

Also, it has been found that annealing at approximate 140 degrees Centigrade induces crystallinity in the PVDF-TrFE 402, which may strongly affects the nature of internal dipoles. Generally, postproduction annealing at this temperature is also be beneficial for P3HT:PCBM OPVs.

In another embodiment of the invention, ferroelectric dipoles, such as PVDF-TrFE 402, are employed at the electrode/organic active layer interface to enhance photocurrent, and either further increase Voc, or at least make Voc more robust to parameters that can degrade it (e.g., such as dark current or electrode work-function). These embodiments include the use of ferroelectric dipoles at both organic/electrode interfaces in an OPV cell, that is, at both the anode and the cathode. Because of internal switchable dipoles, PVDF-TrFE 402, and ferroelectrics in general, can be considered non-specific to the electrode.

Because PVDF-TrFE 402 is insulating in nature, the OPV device typically does not have a very thick layer of the ferroelectric material between the active layer 404 and the cathode 408 electrode, which may be made of a metal such as aluminum for example. The following methods may be used to provide an appropriate coating of PVDF-TrFE 402 between the active layer 404 and anode 410:

1) Blending PVDF-TrFE 402 with P3HT and spin-coating a first layer before spin-coating the main active layer 404 of P3HT:PCBM. Proper choice of solvents would prevent complete dissolution of the first layer by the next;
2) Blending PVDF-TrFE 402 with poly(3,4-ethylenedioxythiophene) (PEDOT) doped with poly(styrenesulfonate) (PSS) (hereinafter "PEDOT:PSS") 406 and spin-coating the blend layer on the top of the anode 410, which may be a transparent conductor, such as indium tin oxide (ITO) for example; and
3) Depositing a few monolayers of PVDF-TrFE 402 above PEDOT:PSS 406 using the Langmuir-Blodgett technique or by spin-coating from a diluted solution.

Other somewhat similar methods may be used to deposit a layer of ferroelectric material, such as PVDF-TrFE 402, between the active layer and the cathode 408:

1) Blending PVDF-TrFE 402 with PCBM and spin-coating the blended layer on the top of the active layer 404 before depositing the cathode 408. Proper choice of solvents would prevent complete dissolution of the first layer by the next.
2) Blending PVDF-TrFE 402 with titanium dioxide (TiO$_2$) or zinc oxide (ZnO) nanoparticles and spin-coating the blended layer on the top of a layer of ITO 410. The ITO 410 may be deposited on a transparent substrate 412, such as glass.
3) Depositing a few monolayers of PVDF-TrFE 402 above the active layer using the Langmuir-Blodgett technique or by spin-coating from a diluted solution, in both cases using a solvent orthogonal to the active layer 404.

It has been shown in tests with two different OPV structures, in this case BHJ and bilayer, based on a P3HT:PCBM material system that the addition of ferroelectric dipoles can significantly improve photovoltaic performance, resulting in enhancements to overall power conversion efficiency for BHJ and bilayer cells of approximately 52% and 60%, respectively. The ferroelectric material embedded in the OPV active-layer can increase OPV efficiency by mitigating the effects of some of the aforementioned sources of energy loss. First, the mismatch of the active layer refractive index and the embedded ferroelectric material refractive index can lead to light scattering sites advantageous for optical absorption. Second, the permanent electrical polarization of ferroelectric dipoles can generate localized enhancements of electric field within the active-layer. This provides two primary benefits. One is an increase in carrier drift length, which is a product of charge mobility and lifetime. The other benefit relates to an increase in the electric field which enhances exciton dissociation. According to the modified Braun model, in the presence of an electric field (e.g., <10$^5$ V/cm), the probability of ionizing an exciton is a function of electric field strength (E) and binding energy (EB), $$\varphi(E) = \frac{1}{1 + \frac{\omega_0}{F(E)} e^{\frac{E_\delta}{kT}}} \quad (1)$$

where F(E) is a function of $e^3 E/8\pi\varepsilon_0 \varepsilon k^2 T^2$. It has been estimated that the binding energies of singlet exciton (SE) and charge transfer exciton (CTE) are in the range of 0.4-0.7 eV and 0.2-0.3 eV, respectively. Both energies are an order of magnitude higher than kT at room temperature (i.e., approximately 0.026 eV), making the exponential term $$(e^{E_B/kT}$$

in equation (1) very large. Thus, a high E (strong electric field) is needed to increase ionization. The above model is supported by various studies which show that photocurrent in BHJ OPVs saturates only under a large (e.g., >10 V) external reverse bias. This implies that complete exciton fission requires an internal electric field of about 50-70 V/μm, which is much higher than the field generated by the difference in the work-functions of the electrodes (typically 1-10 V/μm).

PVDF-TrFE 402 exhibits a net dipole moment at room temperature. Also, it has a dielectric constant of about 11, much higher than that of organic semiconductors, which is typically about two. As such, PVDF-TrFE 402 also exhibits favorable properties related to scattering assisted optical absorption. Using the classical dipole-field model, $$E = \frac{4\pi}{\varepsilon} \sigma f$$

where ε is the relative permittivity of PVDF-TrFE 402, σ is the pyroinduced surface charge density (approximately 6 μC/cm2 for PVDF-TrFE 402), and where f is the volume fraction occupied by the dipoles. The theoretical enhancement to the device's local internal field is about 8*103*fV/μm. As such, a small volume fraction. for example 3%, corresponds to an electric field of ~240 V/μm, which is sufficient to dissociate SEs and CTEs.

By incorporating the ferroelectric copolymer, PVDF-TrFE 402, in the active layers 404 of P3HT:PCBM based OPVs, the device performance is improved significantly. In some cases, embedding ferroelectric dipoles in the active-layer of BHJ devices increases the efficiency by as much as 50% or more. Upon addition of PVDF-TrFE 402, the internal quantum efficiency of some BHJ devices approached 100% for certain wavelengths of light, indicating complete exciton harvesting at these photon energies. This also implies that nearly every SE and CTE results in free charge carriers.

All references, including publications, patent applications, and patents cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An organic photovoltaic device, comprising:
a transparent substrate;
a first electrode of conductive material disposed on the transparent substrate;
an active layer of organic photovoltaic material disposed on the first electrode, the active layer configured to convert photonic energy into electrical energy; and
a second electrode on top of the active layer of organic photovoltaic material;
wherein the active layer comprises poly(3-hexylthiophene) (P3HT), [6,6]-phenyl-C61-butyric acid methyl ester (PCBM), and poly (vinylidenefluoride-co-trifluoroethylene) (PVDF-TrFE); and
wherein the active layer of organic photovoltaic material has ferroelectric dipoles dispersed therein.

2. The device of claim 1, wherein the portion of the active layer of organic photovoltaic material that comprises PVDF-TrFE is between 0% and 25% by weight.

3. The device of claim 1, wherein the PVDF-TrFE is dispersed primarily in the P3HT.

4. The device of claim 1, wherein the PVDF-TrFE is dispersed primarily in the PCBM.

5. The device of claim 1, wherein the PVDF-TrFE is homogeneously dispersed in both the P3HT and the PCBM.

6. The device of claim 1, wherein the PVDF-TrFE is located at an interface of the P3HT and PCBM.

7. The device of claim 1, wherein the PVDF-TrFE has been annealed to induce crystallinity.

8. The device of claim 1, further comprising a thin film of PVDF-TrFE between the active layer and the first electrode.

9. The device of claim 8, wherein the thin film of PVDF-TrFE between the active layer and the first electrode is part of a blended layer of PVDF-TrFE and P3HT disposed between the first electrode and the active layer.

10. The device of claim 8, wherein the thin film of PVDF-TrFE between the active layer and the first electrode is part of a blended layer of PVDF-TrFE and poly(3,4-ethylenedioxythiophene) that is doped with poly(styrenesulfonate) disposed between the first electrode and the active layer.

11. The device of claim 8, further comprising a layer of poly(3,4-ethylenedioxythiophene) that is doped with poly(styrenesulfonate) (PEDOT:PSS) disposed on the first electrode, wherein the thin film of PVDF-TrFE is disposed on the layer of PEDOT:PSS.

12. The device of claim 1, further comprising a thin film of PVDF-TrFE between the active layer and the second electrode.

13. The device of claim 12, wherein the thin film of PVDF-TrFE between the active layer and the second electrode is part of a blended layer of PVDF-TrFE and PCBM disposed between the active layer and the second electrode.

14. The device of claim 12, wherein the thin film of PVDF-TrFE between the active layer and the second electrode is part of a blended layer of PVDF-TrFE and titanium dioxide ($TiO_2$) or zinc oxide (ZnO) nanoparticles between the active layer and the first electrode.

15. The device of claim 1, wherein the first electrode comprises indium tin oxide.

16. The device of claim 1, wherein the second electrode comprises aluminum.

17. The device of claim 1, wherein the transparent substrate comprises glass.

18. The device of claim 1, wherein the ferroelectric dipoles create a reverse electric field of about $10^5$ volts per meter at a volume fraction of from 1% to 10%.

19. The device of claim 1, wherein the PVDF-TrFE exhibits a net dipole moment at room temperature.

20. The device of claim 1, wherein the PVDF-TrFE has a dielectric constant of about 11.

* * * * *